United States Patent

Stokes et al.

[11] Patent Number: 5,552,655
[45] Date of Patent: Sep. 3, 1996

[54] LOW FREQUENCY MECHANICAL RESONATOR

[75] Inventors: Robert B. Stokes, Rancho Palos Verdes; Jay D. Cushman, Long Beach; Drew Cushman, Lomita, all of Calif.

[73] Assignee: TRW Inc., Redondo Beach, Calif.

[21] Appl. No.: 450,226

[22] Filed: May 25, 1995

Related U.S. Application Data

[63] Continuation of Ser. No. 238,113, May 4, 1994, abandoned.

[51] Int. Cl.$^6$ .................................................. H01L 41/08
[52] U.S. Cl. .......................... 310/330; 301/321; 301/324; 301/332; 301/366
[58] Field of Search ................................. 310/330–332, 310/321, 324, 366

[56] References Cited

U.S. PATENT DOCUMENTS

| | | | |
|---|---|---|---|
| 1,860,529 | 5/1932 | Cady | 310/332 X |
| 3,489,931 | 1/1970 | Teaford | 310/366 X |
| 3,566,166 | 2/1971 | Borner | 310/321 |
| 3,614,483 | 10/1971 | Berlincourt | 310/321 |
| 3,621,309 | 11/1971 | Yokoyama | 310/321 |
| 3,634,787 | 1/1972 | Newell | 310/321 X |
| 4,293,986 | 10/1981 | Kobayashi et al. | 310/370 X |
| 4,362,961 | 12/1982 | Gerber | 310/370 |
| 4,421,621 | 12/1983 | Fujii et al. | 310/370 X |
| 4,456,850 | 6/1984 | Inoue et al. | 310/324 |
| 4,517,486 | 5/1985 | Andrews | 310/321 X |
| 4,556,812 | 12/1985 | Kline et al. | 310/324 |
| 4,642,508 | 2/1987 | Suzuki et al. | 310/324 X |
| 5,034,645 | 7/1991 | Woodruff et al. | 310/332 X |
| 5,126,615 | 6/1992 | Takeuchi et al. | 310/324 X |
| 5,162,691 | 11/1992 | Mariani et al. | 310/324 X |
| 5,185,589 | 2/1993 | Krishnaswamy et al. | 310/324 X |
| 5,210,455 | 5/1993 | Takeuchi et al. | 310/324 X |
| 5,233,259 | 8/1993 | Krishnaswamy et al. | 310/324 |
| 5,248,912 | 9/1993 | Zdeblick et al. | 310/332 |
| 5,302,880 | 4/1994 | Kaida | 310/370 |
| 5,382,930 | 1/1995 | Stokes et al. | 310/321 X |

FOREIGN PATENT DOCUMENTS

| | | | |
|---|---|---|---|
| 0072277 | 4/1985 | Japan | 310/324 |

OTHER PUBLICATIONS

Cushman, D. et al., "Sbar Filter Monolithically Integrated With HBT Amplifier" TRW Electronic Systems Group, Redondo Beach, California Advanced Microelectronics Laboratory.

Stokes, R. B. et al., "Thin Film Acoustic Filters On GaAs", IEEE MTT Symposium May 1992, Albuquerque, New Mexico.

Campbell, Colin K., "Applications Of Surface Acoustic And Shallow Bulk Acoustic Wave Devices", Proceedings of the IEEE, vol. 77, No. 10, Oct. 1989, pp. 1453–1461.

*Primary Examiner*—Mark O. Budd

[57] ABSTRACT

A low frequency mechanical resonator that resonates at relatively low frequencies and can be fabricated as part of an integrated circuit. The resonator includes a piezoelectric structure having a top piezoelectric layer and a bottom piezoelectric layer positioned over a recessed area in a substrate. A top input electrode is positioned on the top surface of the top piezoelectric layer, a middle shield electrode is positioned between the piezoelectric layers, and a bottom output electrode is positioned on the bottom surface of the bottom piezoelectric layer adjacent the recessed area. By applying an appropriate alternating current to the top electrode, the top piezoelectric layer is alternately contracted and expanded. Because the top piezoelectric layer is secured to the bottom piezoelectric layer, the piezoelectric structure will flex up and down in order to relieve stress within the structure. The flexing of the piezoelectric structure causes flexural waves within the piezoelectric structure which resonate at a particular frequency depending on the membrane material, membrane thickness, and the width of the recessed area. The top and bottom electrodes can be replaced with interdigital transducers in order to select particular higher order flexural resonances for higher resonant frequencies.

18 Claims, 1 Drawing Sheet

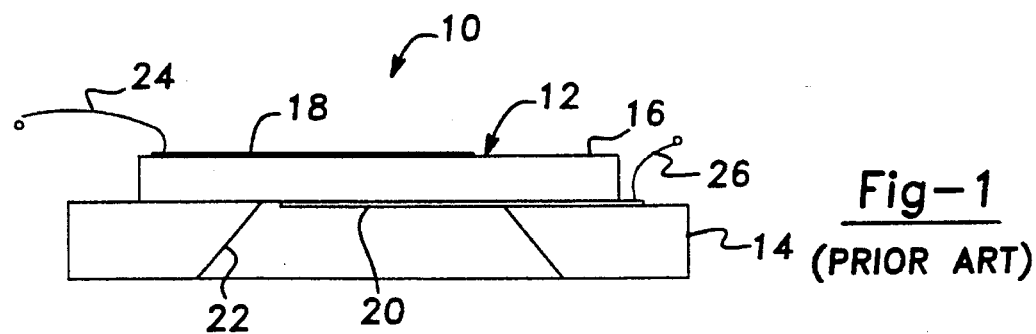
Fig-1 (PRIOR ART)
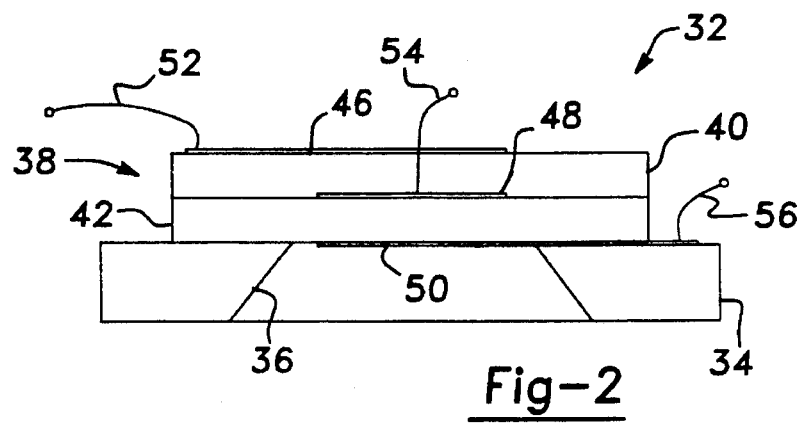
Fig-2
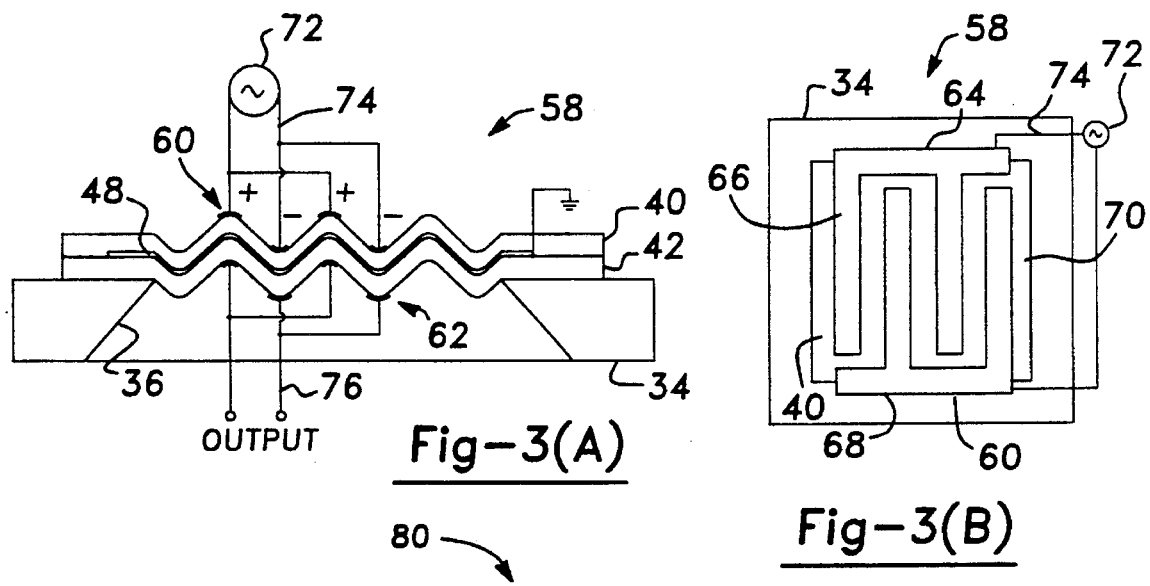
Fig-3(A)
Fig-3(B)
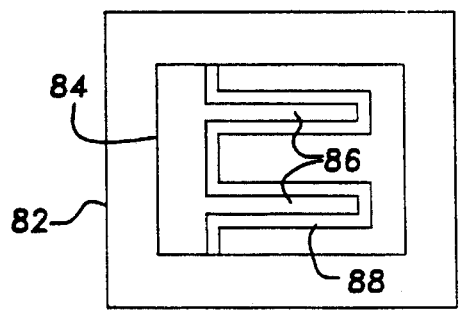
Fig-4

LOW FREQUENCY MECHANICAL RESONATOR

This is a continuation of U.S. patent application Ser. No. 08/238,113, filed May 4, 1994, now abandoned.

BACKGROUND OF THE INVENTION

1. Field of the Invention

This invention relates generally to a low frequency mechanical resonator and, more particularly, to a piezoelectric resonator filter capable of being fabricated as part of an integrated circuit on a single chip and being capable of selecting relatively low frequencies.

2. Discussion of the Related Art

Analog integrated circuits, such as amplifiers, mixers, and the like, configured on a single integrated chip, such as a monolithic microwave integrated circuit (MMIC), are rapidly replacing larger more cumbersome pieces of electronic hardware which perform the same function. However, narrow band analog filters and resonators, that have bandwidths less than 2%, have as of yet not been developed so as to be effectively integrated on a single chip as part of an integrated circuit. Devices such as crystal resonators, surface acoustic wave (SAW) resonators and SAW filters, known to those skilled in the art, provide outstanding performance as discrete devices, but are too large to be integrated on a single chip. Consequently, development of resonators on an integrated circuit level that have desirable performance is currently under way.

Semiconductor bulk acoustic resonators (SBAR) are emerging as one viable device for use as a resonator and filter in integrated circuits. Such a device is disclosed in the paper R. B. Stokes et al., "X-Band Thin Film Acoustic Filters on GaAs," presented at the 1992 IEEE MTT Symposium. FIG. 1 shows a typical prior art SBAR circuit element 10 which includes an SBAR 12 positioned on a substrate 14. The SBAR 12 includes a thin piezoelectric layer 16 formed between top and bottom metal film electrodes 18 and 20. The SBAR 12 is configured on the substrate 14 over a backside via recess 22 etched in the substrate 14. In a typical case, the substrate 14 is GaAs, having a thickness of about 4 mils, the piezoelectric layer 16 is aluminum nitride (AlN), and the electrodes 18 and 20 are aluminum having a thickness of about 1000 Å. The recess 22 adjacent the SBAR 12 is square where each side is approximately 300 microns. By applying a suitable alternating current to the top and bottom electrodes 18 and 20 by leads 24 and 26, respectively, the piezoelectric layer 16 will alternately expand and contract in association with the alternating current so as to generate a longitudinal wave within the piezoelectric layer 16. The piezoelectric layer 16 will resonate at a narrow band frequency. The recess 22 enables the SBAR 12 to vibrate without losing acoustic energy to the GaAs substrate 14. By stacking SBAR piezoelectric membranes in an SBAR structure, a two-port filter can be developed for producing a narrow band output signal.

The SBAR circuit element 10 has been shown to be effective as a resonator for selecting narrow bandwidth frequencies within the range of about 500 MHz to about 20 GHz. However, because the SBAR 12 resonates as a result of longitudinal waves travelling in the thickness direction of the piezoelectric layer 16, this device is impractical at frequencies lower than 500 MHz. For output frequencies below 500 MHz the piezoelectric film required to get a desirable resonance becomes very thick and difficult to fabricate. Therefore, acoustic resonators and filters at these lower frequencies cannot be effectively fabricated as part of an integrated circuit.

What is needed is a resonator and filter which can be fabricated as part of an integrated circuit, and which selects narrow bandwidths at relatively low frequencies. It is therefore an object of the present invention to provide such a resonator and filter.

SUMMARY OF THE INVENTION

In accordance with the teachings of the present invention, a low mechanical resonator is disclosed which can be fabricated as part of an integrated chip, and which provides a sharp narrow band resonance at a low frequency. Basically, the low mechanical resonator is a modification of the SBAR discussed above, but which produces flexural waves instead of longitudinal waves. The flexural waves are caused by a piezoelectric membrane bending or flexing up and down so that the bending stiffness of the membrane causes the restoring force as opposed to compression or dilation stresses in the longitudinal wave SBAR piezoelectric membrane. In this manner, the flexural waves propagate in the plane of the membrane as opposed to its thickness.

In order to produce the flexural waves, a piezoelectric structure including a top piezoelectric layer and a bottom piezoelectric layer is positioned over a recess in a semiconductor substrate. An input electrode is positioned on a top surface of the top piezoelectric layer, a shield electrode is positioned between the top and bottom piezoelectric layers, and an output electrode is positioned on a bottom surface of the bottom piezoelectric layer adjacent the recess. By applying alternating potentials to the top electrode at an appropriate frequency and grounding the shield electrode, the top piezoelectric layer is caused to expand and contract in association with the frequency of the alternating potential. This expansion and contraction occurs in the plane of the film as well as perpendicular to it. Because the top piezoelectric layer is rigidly secured to the bottom piezoelectric layer, the entire piezoelectric structure will flex up and down in order to best relieve its stress. As the piezoelectric structure flexes, flexural waves are created. The flexural waves will reflect off both edges of the free membrane, which are the edges of the recess. If the wave reinforces itself after its edge reflections, a mechanical resonance occurs. This resonance will produce a strong electrical signal at the output electrode. This strong signal will only be present for frequencies very close to the mechanical resonant frequency. If desired, the film electrodes can be formed with periodic patterns, such as those of interdigital transducers, in order to selectively excite higher order flexural modes.

Additional objects, advantages, and features of the present invention will become apparent from the following description and appended claims, taken in conjunction with the accompanying drawings.

BRIEF DESCRIPTION OF THE DRAWINGS

FIG. 1 is a profile view of a prior art SBAR;

FIG. 2 is a two-port low frequency mechanical resonator according to a preferred embodiment of the present invention;

FIGS. 3(A) and 3(B) are a cutaway side view and a top view, respectively, of a two-port flexural wave filter incorporating interdigital transducers according to another embodiment of the present invention; and FIG. 4 is a top view of a flexural mode wave filter including cantilever flexural vibrators according to another embodiment of the present invention.

DETAILED DESCRIPTION OF THE PREFERRED EMBODIMENTS

The following description of the preferred embodiments concerning flexural wave mechanical resonators and filters are merely exemplary in nature and are in no way intended to limit the invention or its applications or uses.

The mechanical resonator of the present invention uses a structure similar to known two-port SBAR filters. However, the piezoelectric membrane of the present invention resonates by flexural waves rather than by longitudinal waves in the SBAR filter. Flexural waves cause the piezoelectric membrane to actually bend up and down, so that the bending stiffness of the membrane is the source of the restoring force as opposed to compression or dilation stress in the longitudinal wave membrane. Additionally, the flexural waves propagate in the plane of the piezoelectric membrane as opposed to the thickness of the membrane in the SBAR.

Flexural waves can propagate much slower than longitudinal waves. The longitudinal acoustic wave in an SBAR having an AlN membrane travels at approximately 10,400 meters per second. Flexural waves in the same structure travel as slowly as a few hundred meters per second. Flexural waves would be reflected from the edges of an unsupported piezoelectric membrane, giving a resonator "length" of several hundred micrometers of membrane width, rather than the "length" in the SBAR of a few micrometers of thickness. The lower velocity and longer path can give a much lower resonant frequency than is achievable in the SBAR.

The electrodes 18 and 20 of SBAR 12 could not launch a flexural mode wave because the electric field in the piezoelectric layer 16 is uniform through the thickness of the film 16, and thus, any strain to the top surface is the same as the strain on the bottom surface. Therefore, a two layer structure with at least three electrodes is required.

FIG. 2 shows a two-port flexural wave mechanical resonator and filter 32 according to a preferred embodiment of the present invention. The filter 32 includes a substrate 34 having a recess 36 formed by an appropriate semiconductor etching step known to those skilled in the art. Positioned on a top surface of the substrate 34 relative to the recess 36 is a piezoelectric structure 38. The piezoelectric structure 38 includes a top piezoelectric layer 40 and a bottom piezoelectric layer 42. A top input metal film electrode 46 is positioned on the top surface of the piezoelectric layer 40 opposite to the piezoelectric layer 42. A middle shield metal film electrode 48 is positioned between the piezoelectric layers 40 and 42. And a bottom output metal film electrode 50 is positioned in contact with a bottom surface of the piezoelectric layer 42 adjacent to the recess 36. An input lead 52 is electrically connected to the electrode 46, a ground lead 54 is electrically connected to the electrode 48, and an output lead 56 is electrically connected to the bottom electrode 50. In a preferred embodiment, the piezoelectric layers 40 and 42 are AlN each having a thickness of about 4500 Å, the film electrodes 46, 48 and 50 are aluminum having a thickness of about 1000 Å, and the substrate 34 is GaAs having a thickness of about 4 mils. The recess 36 is typically square in nature having sides approximately 300 microns long adjacent the piezoelectric structure 38.

The above-described filter 32 is operable as a two-port SBAR filter as disclosed in the R. B. Stokes et al. article referenced above. When operating as a two-port SBAR filter, a high frequency alternating current input signal is applied to the lead 52 and the lead 54 is grounded. If the signal has power at the SBAR resonant frequency, the piezoelectric structure 38 resonates by longitudinal waves to produce a narrow band output signal on the lead 56. However, this structure can also operate as a two-port flexural wave filter for producing resonant waves at relatively low frequencies.

In the flexural mode, a low frequency alternating current signal is applied to the lead 52 and the lead 54 is grounded. When one potential is applied to the lead 52, the piezoelectric layer 40 is caused to contract in directions parallel to the membrane. Since the piezoelectric layer 40 is rigidly secured to the piezoelectric layer 42, a contraction of the piezoelectric layer 40 will cause the piezoelectric structure 38 to bow or flex such that the ends of the piezoelectric structure 38 turn upwards in order to reduce the overall strain in the structure 38. By reversing the polarity on the input lead 52, the piezoelectric layer 40 will expand such that the ends of the piezoelectric structure 38 are caused to bow or flex downwards in the same manner. Such a system can be likened to a bimetallic strip in which heat causes one of the metals to expand or contract more than the other metal so as to cause flexure in the strip. By alternating the polarity on the lead 52 at a particular frequency that is lower than would cause longitudinal resonating waves, the piezoelectric structure 38 is caused to alternately flex up and down at a predetermined rate, and flexural waves are generated within the plane of the piezoelectric structure 38. The electrodes 48 and 50 around the bottom piezoelectric layer 42 also work as a flexural mode transducer and can serve to re-convert the flexural wave to an electrical signal. Such a configuration allows for a two-port filter with an input and output separated and a shielding ground plane between such that an output at lead 56 is a narrow band frequency component of the input signal.

FIGS. 3(A) and 3(B) show a flexural mode filter 58 according to another preferred embodiment of the present invention. In this embodiment, the film electrodes 46 and 50 are replaced with interdigital transducers (IDT) 60 and 62, respectively. Interdigital transducers have previously been disclosed with reference to SAW resonators, mentioned above, as evidenced by the article Campbell, "Applications Of Surface Acoustic And Shallow Bulk Acoustic Wave Devices," Proceedings of the IEEE, Vol. 77, No. 10, October 1989. The interdigital transducer 60 includes a first electrode trace 64 having a comb of fingers 66 and a second electrode trace 68 having a comb of fingers 70, such that the fingers 66 and 70 are intertwined in an alternating configuration as shown in FIG. 3(B). The interdigital transducer 62 has electrode traces configured in the same manner. The shielding electrode 48 still remains a film electrode.

By applying an alternating potential from an alternating current source 72 to the interdigital transducer 60 by leads 74 either between the combs of fingers 66 and 70, between one comb of fingers 66 and the shield electrode 48, or between both combs of fingers 66 and 70 and the shield electrode 48, it is possible to create a higher flexural wave that causes several bends in the piezoelectric structure 38 as shown in FIG. 3(A). It is possible to eliminate the second electrode trace 68 and a second electrode trace associated with the interdigital transducer 62 and still achieve the same effect if the signal is applied between the remaining trace and the shield electrode 48. In other words, each of the interdigital transducers 60 and 62 can have one comb of fingers. It is only necessary that a periodically varying electric field be applied to the structure 38. The combination of the electrode 48 and the interdigital transducer 62 around the bottom piezoelectric layer 42 produces a narrow band output signal on leads 76.

The film electrodes 46, 48 and 50 of FIG. 2 will provide the lowest resonant frequencies, typically on the order of 100 kHz to 5 MHz. The interdigital transducer electrodes 60 and 62 of FIGS. 3(A) and 3(B) can provide medium frequencies, typically on the order of 5 MHz to approximately 500 MHz. By adjusting the number of fingers and the width of the fingers, the frequency can be further defined. By incorporating more fingers, the selectivity of the output frequency can be enhanced and a single higher-order resonant mode can be selected. Simulations have shown that an interdigital transducer with 2.5 micrometer finger widths could single out a high-order flexural mode centered at about 65 MHz in these types of systems. Consequently, the incorporation of the flexural mode filters discussed above, and the prior art SBAR filters, can provide resonators and filters applicable to be used in integrated circuits to cover the entire spectrum of about 100 kHz to 20 GHz for sub-millimeter, on-chip acoustic devices.

The flexural mode transducer principle may also be extended to a broad array of actuator and sensor applications as a result of the fact that film flexing can be performed at frequencies all the way down to the DC level. FIG. 4 shows yet another embodiment of the invention in which flexural waves create resonation. In FIG. 4, a top view of a resonator 80 is shown including a substrate 82, having a recess (not shown), and a piezoelectric membrane 84 positioned over the recess. The piezoelectric membrane 84 has been ion milled to form two cantilever flexural vibrators 86. The ion milling produces an appropriate shaped gap 88 through the membrane 84 such that the cantilever flexural vibrators 86 are formed. By applying an appropriate potential to the cantilever flexural vibrators 86, the cantilever flexural vibrators 86 will vibrate up and down causing flexural waves in the membrane 84.

By replacing the piezoelectric layers 40 and 42 with two piezoelectric membranes 84 including the flexural vibrators 86, the resulting structure can serve as a bandpass filter with even lower frequency than the filter 32, above. FIG. 4 would show a top view of such a structure, and FIG. 2 would show a side view of this structure. The top electrode is not shown in FIG. 4. The cantilever flexural vibrators 86 would be formed such that the gap 88 extended through the entire structure. In other words, the flexural vibrators 86 would be a sandwich structure including two piezoelectric membranes and an electrode positioned therebetween. The electrodes 46 and 50 would be connected to the top piezoelectric membrane and the bottom piezoelectric membrane, respectively, such that an alternating potential that is applied to the electrode 46 would cause the cantilever flexural vibrators 86 to resonate in a flexural mode, which in turn would cause a narrow band output signal at the electrode 50. If desired, multiple flexural vibrators with different frequencies can be fabricated in the same membrane to produce a bank of channelizing filters.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A flexural mode resonator comprising:

a substrate;

a piezoelectric device positioned on the substrate, said piezoelectric device including a first piezoelectric layer and a second piezoelectric layer being rigidly secured to each other, said piezoelectric device further including a first electrode positioned on one surface of the first piezoelectric layer opposite to the second piezoelectric layer, a second electrode positioned on one surface of the second piezoelectric layer, and a third electrode positioned between the first and second piezoelectric layers, said first electrode being a first interdigital transducer including a plurality of fingers, said third electrode being a ground reference electrode; and an alternating potential signal source means for generating an alternating potential signal, said first interdigital transducer being responsive to an alternating potential input signal from the alternating potential signal source means, said alternating potential input signal having a frequency that will cause the first piezoelectric layer to be longitudinally compressed and expanded in association with the alternating potential input signal so as to cause the piezoelectric device to flex at a resonant frequency in order to produce resonant flexural waves in the piezoelectric device, wherein the alternating potential input signal applied to the first interdigital transducer causes the piezoelectric device to flex simultaneously in a plurality of locations.

2. The resonator according to claim 1 wherein the second and third electrodes are film electrodes.

3. The resonator according to claim 2 wherein the film electrodes are aluminum having a thickness of approximately 1000 Å.

4. The resonator according to claim 1 wherein an output signal is taken from the second electrode, said output signal being a narrow band component of the input signal.

5. The resonator according to claim 1 wherein said second electrode generates a narrow band component of the alternating potential input signal, said narrow band component being between 100 kHz and 5 MHz.

6. The resonator according to claim 1 wherein the second electrode is a second interdigital transducer including a plurality of fingers, wherein an output signal taken from the second interdigital transducer provides a narrow band frequency component of the alternating potential input signal.

7. The resonator according to claim 1 wherein the first interdigital transducer includes a first electrode trace having a plurality of fingers and a second electrode trace having a plurality of fingers such that the fingers of the first electrode trace are intertwined with the fingers of the second electrode trace in an alternating configuration, and wherein the alternating potential input signal is applied to the first and second electrode traces so as to cause the piezoelectric device to flex simultaneously in a plurality of locations.

8. The resonator according to claim 7 wherein the second electrode is a second interdigital transducer including a third electrode trace having a plurality of fingers and a fourth electrode trace having a plurality of fingers such that the fingers of the third electrode trace are intertwined with the fingers of the fourth electrode trace in an alternating configuration, and wherein an output signal taken from the second interdigital transducer provides a narrow band frequency component of the alternating potential input signal.

9. The resonator according to claim 1 wherein the third electrode is a shielding film electrode, said shielding film electrode being grounded.

10. The resonator according to claim 1 wherein the first and second piezoelectric layers are aluminum nitride and the substrate is gallium arsenide.

11. The resonator according to claim 1 wherein the substrate is a semiconductor substrate including a recess and said piezoelectric device is positioned over the recess.

12. A method of generating an acoustic resonance signal, said method comprising the steps of:

providing a substrate;

providing a piezoelectric device in contact with the substrate, said piezoelectric device including a first piezoelectric layer and a second piezoelectric layer being rigidly secured to each other, said piezoelectric device further including a first electrode positioned on one surface of the first piezoelectric layer opposite to the second piezoelectric layer, said first electrode being a first interdigital transducer including a series of fingers, a second electrode positioned on one surface of the second piezoelectric layer opposite to the first piezoelectric layer, and a third electrode positioned between the first and second piezoelectric layers, said third electrode being a ground reference electrode; and applying an alternating potential input signal to the first interdigital transducer such that a frequency of the alternating potential signal will cause the first piezoelectric layer to longitudinally contract and expand at a frequency in association with the input signal so as to cause the piezoelectric device to flex at a resonant frequency in order to produce flexural waves in the piezoelectric device, wherein the alternating potential input signal applied to the first interdigital transducer causes the piezoelectric device to flex simultaneously in a plurality of locations.

13. The method according to claim 12 wherein the second electrode is a second interdigital transducer including a series of fingers, and wherein the step of applying an input signal produces a narrow band output signal at the second interdigital transducer.

14. The method according to claim 12 wherein the step of providing a piezoelectric device includes providing the first interdigital transducer on the top surface of the first piezoelectric layer and a second interdigital transducer on a bottom surface of the second piezoelectric layer, wherein each of the first and second interdigital transducers includes a first and second electrode trace, each electrode trace including fingers such that the fingers of the first electrode trace are intertwined with the fingers of the second electrode trace in an alternating configuration, and wherein the step of applying an alternating potential input signal includes applying an alternating potential input signal to the first and second traces of the first interdigital transducer so as to cause the piezoelectric device to flex in a plurality of locations and produce a narrow band output signal at the second interdigital transducer.

15. The method according to claim 12 wherein the step of applying an alternating potential input signal includes applying an input signal of a frequency which produces a narrow band resonance at the second electrode within the range of about 100 kHz to 5 MHz.

16. The method according to claim 12 wherein the step of applying an input signal includes applying an input signal of a frequency range which generates a resonant output frequency within the range of about 5 MHz to about 500 Mhz.

17. A flexural mode resonator comprising:

a substrate including a recess; and a piezoelectric device positioned on the substrate over the recess, said piezoelectric device including a first piezoelectric layer and a second piezoelectric layer being rigidly secured to each other, said piezoelectric device further including a first interdigital transducer positioned on one surface of the first piezoelectric opposite to the second piezoelectric layer, said first interdigital transducer including a first electrode trace having a plurality of fingers and a second electrode trace having a plurality of fingers such that the fingers of the first electrode trace are intertwined with the fingers of the second electrode trace in an alternating configuration, said piezoelectric device further including a shield electrode positioned between the first piezoelectric layer and the second piezoelectric layer, said shield electrode being a ground reference electrode; and an alternating potential input signal source means for generating an alternating potential signal said first interdigital transducer being responsive to an alternating potential input signal from the alternating potential signal source means, said alternating potential input signal having a frequency that will cause the first piezoelectric layer to longitudinally compress and expand in association with the alternating potential input signal so as to cause the piezoelectric device to flex at a resonant frequency in order to produce flexural waves in the piezoelectric device.

18. The resonator according to claim 17 further comprising a second interdigital transducer positioned on one surface of the second piezoelectric layer, said second interdigital transducer including a third electrode trace having a plurality of fingers and a fourth electrode trace having a plurality of fingers such that the fingers of the third electrode trace are intertwined with the fingers of the fourth electrode trace in an alternating configuration, wherein an output signal taken from the second interdigital transducer provides a narrow band frequency component of the alternating potential input signal, said narrow band frequency component being less than 5 MHz.

* * * * *